United States Patent
Tani et al.

(10) Patent No.: US 10,591,960 B2
(45) Date of Patent: Mar. 17, 2020

(54) ELECTRONIC DEVICE

(71) Applicant: Panasonic Intellectual Property Management Co., Ltd., Osaka (JP)

(72) Inventors: Kazuya Tani, Osaka (JP); Kenji Nishikawa, Hyogo (JP); Kazuhiro Shiraga, Osaka (JP); Hiroyuki Takaoka, Osaka (JP); Katsuya Yamamoto, Nara (JP); Kazuya Nakano, Osaka (JP); Hiroki Yosho, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/377,082

(22) Filed: Apr. 5, 2019

(65) Prior Publication Data
US 2019/0235586 A1 Aug. 1, 2019

Related U.S. Application Data

(63) Continuation of application No. PCT/JP2017/025687, filed on Jul. 14, 2017.

(30) Foreign Application Priority Data

Dec. 26, 2016 (JP) ................................. 2016-251882

(51) Int. Cl.
*G06F 1/20* (2006.01)
*H01Q 1/22* (2006.01)
(Continued)

(52) U.S. Cl.
CPC .......... *G06F 1/1698* (2013.01); *G06F 1/1643* (2013.01); *G06F 1/1654* (2013.01);
(Continued)

(58) Field of Classification Search
None
See application file for complete search history.

(56) References Cited

U.S. PATENT DOCUMENTS

| 9,665,140 B2* | 5/2017 | Yang | G06F 1/203 |
| 2011/0026223 A1* | 2/2011 | Kaneko | G06F 1/203 |
| | | | 361/692 |

(Continued)

FOREIGN PATENT DOCUMENTS

| JP | 2015-032064 | 2/2015 |
| JP | 2016-081130 | 5/2016 |

OTHER PUBLICATIONS

International Search Report of PCT application No. PCT/JP2017/025687 dated Aug. 15, 2017.

*Primary Examiner* — Xanthia C Cunningham
(74) *Attorney, Agent, or Firm* — Wenderoth, Lind & Ponack, L.L.P.

(57) ABSTRACT

The electronic device includes a case, an antenna element, a heat source, a heat dissipation member, a heat conduction member, a cooling fan, an exhaust port, and an exhaust duct. The case has a pair of main surfaces and side surfaces. The antenna element is used to perform wireless communication. The heat dissipation member exchanges heat with a cooling wind. The heat conduction member conducts heat of the heat source to the heat dissipation member. The cooling fan generates the cooling wind to be blown to the heat dissipation member. The exhaust port is an exhaust port from which the cooling wind is discharged to the outside. The exhaust duct guides the cooling wind to the exhaust port. The exhaust port is disposed on one of the side surfaces, and the antenna element and the exhaust duct are disposed to overlap each other at least partially in the thickness direction.

6 Claims, 11 Drawing Sheets

(51) Int. Cl.
*G06F 1/16* (2006.01)
*H05K 7/20* (2006.01)
(52) U.S. Cl.
CPC ........... *G06F 1/203* (2013.01); *H01Q 1/2266* (2013.01); *H05K 7/2099* (2013.01); *H05K 7/20972* (2013.01)

(56) References Cited

U.S. PATENT DOCUMENTS

| | | | |
|---|---|---|---|
| 2011/0279974 A1* | 11/2011 | Fujiwara | G06F 1/1601 361/692 |
| 2013/0286292 A1* | 10/2013 | Yamaguchi | G06F 1/203 348/725 |
| 2013/0314619 A1* | 11/2013 | Sugiura | H04N 5/64 348/836 |
| 2015/0036277 A1 | 2/2015 | Yukawa et al. | |
| 2016/0357218 A1 | 12/2016 | Yukawa et al. | |

\* cited by examiner

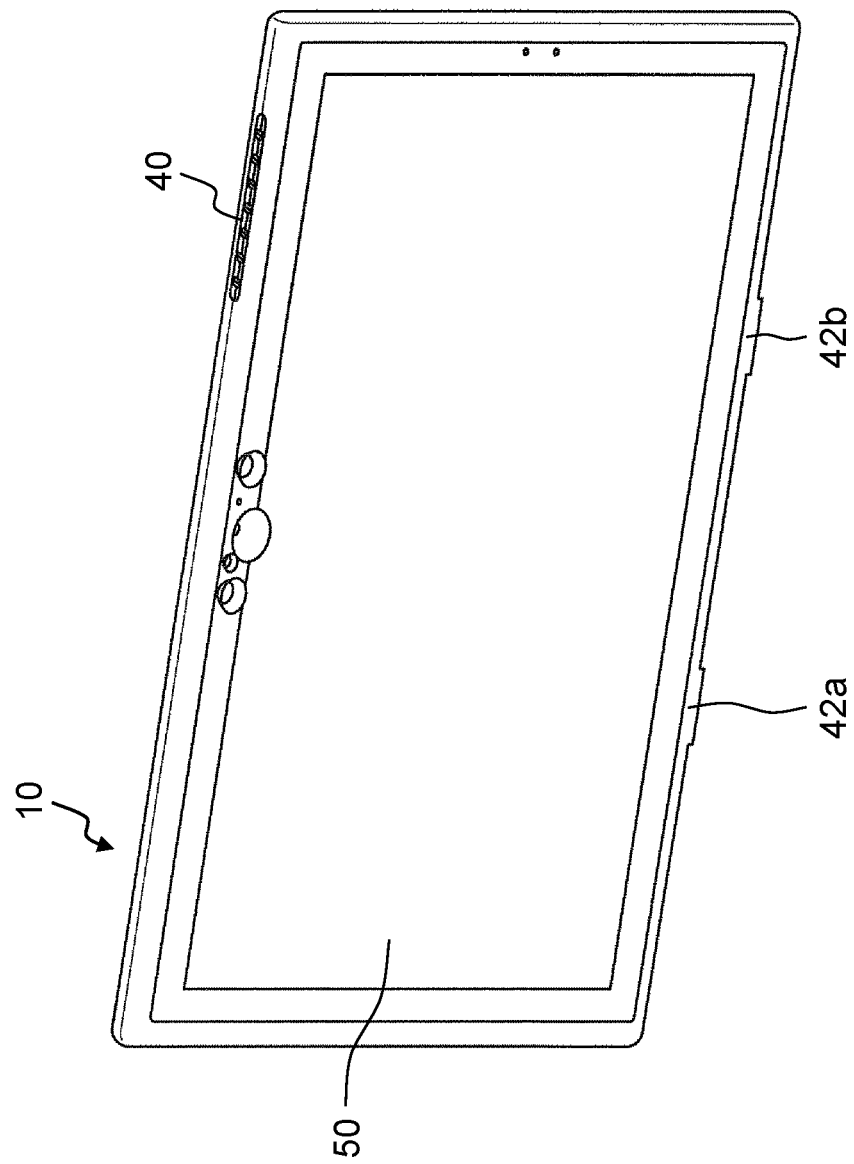

ELECTRONIC DEVICE

TECHNICAL FIELD

The present disclosure relates to an electronic device (for example, a tablet terminal) including an internal antenna element and an air-cooled type cooling mechanism.

BACKGROUND ART

In recent years, there has been developed an information processing device that can be used as a tablet PC when a display part having a touch panel function is detached (see PTL 1, for example). Such an information processing device can be used as a tablet PC when the display part having a touch panel function is detached from a keyboard part. In addition, the information processing device can be also used as a laptop PC by using the display part in a state where the display part having a touch panel function is connected to the keyboard part.

CITATION LIST

Patent Literature

PTL 1: Unexamined Japanese Patent Publication No. 2016-081130

SUMMARY OF THE INVENTION

In general, a tablet PC has various terminals provided on a side surface of the tablet PC, but an area of the side surface is limited, and a layout of the terminals is difficult to design.

The present disclosure provides an electronic device in which space saving and downsizing can be achieved and a degree of freedom in layout design of various terminals is increased in an information processing device having an internal antenna element and an air-cooled type cooling mechanism.

An aspect of the present disclosure provides an electronic device. The electronic device includes a case, an antenna element, a heat source, a heat dissipation member, a heat conduction member, a cooling fan, an exhaust port, and an exhaust duct. The case has a pair of main surfaces facing each other in a thickness direction and side surfaces connecting between the main surfaces. The antenna element is used to perform wireless communication. The heat dissipation member exchanges heat with a cooling wind. The heat conduction member conducts heat of the heat source to the heat dissipation member. The cooling fan generates the cooling wind to be blown to the heat dissipation member. The exhaust port is an exhaust port from which the cooling wind generated by the cooling fan and subjected to heat exchange on the heat dissipation member is discharged to the outside of the electronic device. The exhaust duct guides the cooling wind subjected to heat exchange on the heat dissipation member to the exhaust port. The exhaust port is disposed in one of the side surfaces. The antenna element and the exhaust duct are disposed to overlap each other at least partially in the thickness direction.

With the present disclosure, it is possible to provide an electronic device in which space saving and downsizing can be achieved and a degree of freedom in layout design of various terminals is increased.

BRIEF DESCRIPTION OF THE DRAWINGS

FIG. 2 is a perspective view of a tablet terminal of a first exemplary embodiment.

DESCRIPTION OF EMBODIMENTS

Hereinafter, exemplary embodiments will be described in detail with reference to the drawings as appropriate. However, an unnecessarily detailed description will not be given in some cases. For example, a detailed description of a well-known matter and a duplicated description of substantially the same configuration will be omitted in some cases. This is to avoid the following description from being unnecessarily redundant and thus to help those skilled in the art to easily understand the description.

Note that the inventors provide the accompanying drawings and the following description to help those skilled in the art to sufficiently understand the present disclosure, but do not intend to use the drawings or the description to limit the subject matters of the claims.

First Exemplary Embodiment

Figure 1A:
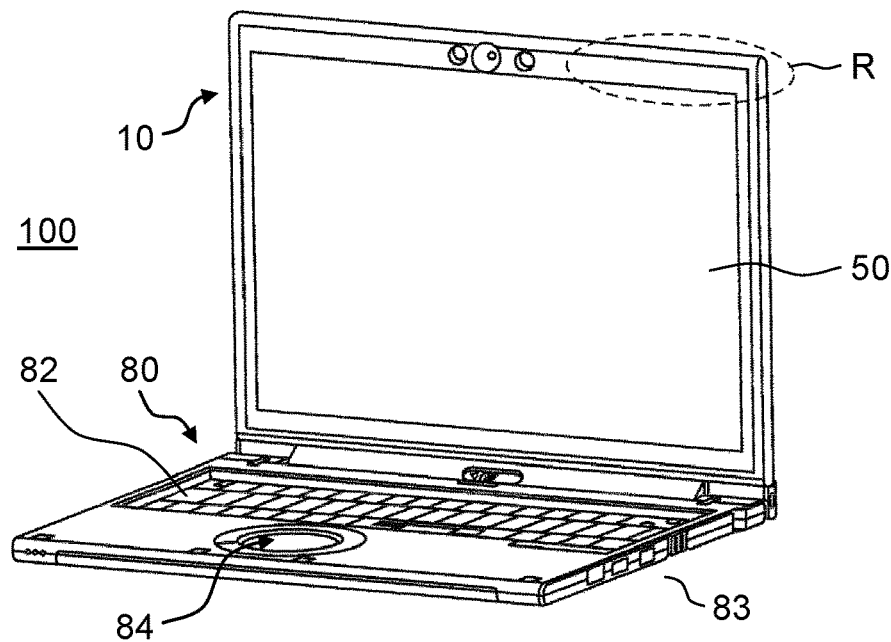
FIG. 1A is a diagram illustrating how a tablet terminal of an example of an electronic device of the present disclosure is connected to a base device.
Figure 1B:
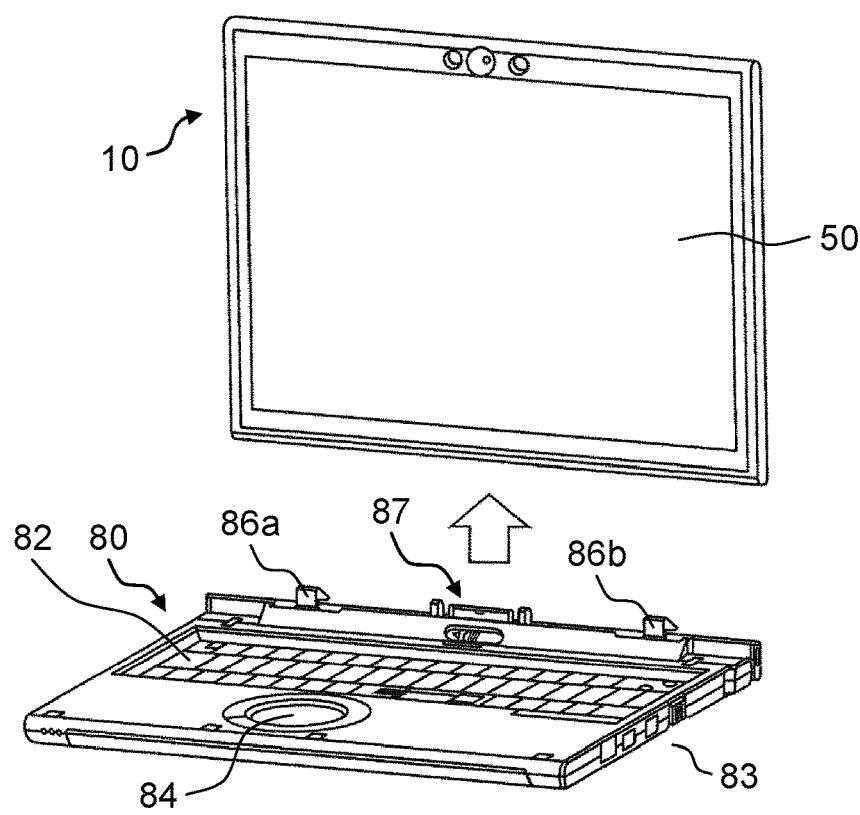
FIG. 1B is a diagram illustrating the tablet terminal detached from the base device.

FIG. 1A and FIG. 1B are diagrams each showing an outer appearance of an information processing device including a tablet terminal of an aspect of the present disclosure. Information processing device 100 includes tablet terminal 10 and base device 80 attachable to tablet terminal 10.

FIG. 1A is a diagram showing tablet terminal 10 to which base device 80 is attached. FIG. 1B is a diagram showing tablet terminal 10 from which base device 80 is detached. FIG. 2 is a perspective view of tablet terminal 10 alone.

Tablet terminal 10 is an electronic device that realizes alone a function as a computer. Base device 80 includes an input unit for tablet terminal 10. As shown in FIG. 1A, when tablet terminal 10 is attached to base device 80, tablet terminal 10 can be used as a laptop-type computer (so-called a detachable type computer) as a whole. Alternatively, when tablet terminal 10 is detached from base device 80 as shown in FIG. 1B, tablet terminal 10 can be also used alone.

Tablet terminal 10 has a rectangular parallelepiped shape having large main surfaces. Tablet terminal 10 has display 50 on one main surface in a thickness direction. Display 50 is such a display device as a liquid crystal display device and an organic EL device, for example. Tablet terminal 10 is provided with a touch panel to cover display 50, and the touch panel can receive a touch operation by a user's finger or a stylus pen.

Tablet terminal 10 incorporates: a central processing unit (CPU); a random access memory (RAM); a non-volatile storage such as a read-only memory (ROM), a solid state drive (SSD), or a hard disk drive (HDD); a battery, and other components. The non-volatile storage (ROM, SSD, HDD, and the like) stores an operating system (OS), various application programs, various data, and the like. The CPU realizes various functions by reading the OS, application programs, and various data and then performing arithmetic processing. The CPU is a heat source and a noise source.

Tablet terminal 10 is provided with connection parts 42a, 42b for connection to base device 80, on one side surface in the width direction. Connection parts 42a, 42b have openings into which hinge parts 86a, 86b of base device 80 are inserted. Connection parts 42a, 42b each have a mechanism in each of connection parts 42a, 42b, and hinge parts 86a, 86b are engaged with the mechanisms when hinge parts 86a, 86b are inserted into the openings of connection parts 42a, 42b. In addition, a connector (not shown) is provided between connection part 42a and connection part 42b to perform data communication with base device 80.

Tablet terminal 10 is provided with exhaust port 40 in the side surface opposite to the side surface on which connection parts 42a, 42b are provided. From this exhaust port 40, an air flow for cooling the CPU serving as a heat source is discharged to outside.

Further, on one side surface of tablet terminal 10, there are provided a power switch and connection terminals to which a power plug, an external device, a memory card, and the like are connected (not shown). Case 11 of tablet terminal 10 is formed of metal such as magnesium alloy or resin, for example (see FIG. 3).

As shown in FIG. 1A and FIG. 1B, base device 80 includes hinge parts 86a, 86b and connector 87 for connection to tablet terminal 10. Hinge parts 86a, 86b are mechanisms for rotatably connecting tablet terminal 10 to base device 80. Hinge parts 86a, 86b each have a projection, are respectively inserted into connection parts 42a, 42b of tablet terminal 10, and are respectively engaged with the mechanisms in connection parts 42a, 42b. Connector 87 has a plurality of terminals, and through the terminals are performed data communication with tablet terminal 10 and supply of power to tablet terminal 10. Further, base device 80 includes keyboard 82 and touch pad 84 as an input unit for tablet terminal 10.

On a side surface of base device 80, there are provided various terminals 83 such as a connection terminal for a memory card, a connection terminal for earphones and a microphone, an HDMI (registered trade mark) terminal, a USB terminal, and a power terminal.

Figure 3:
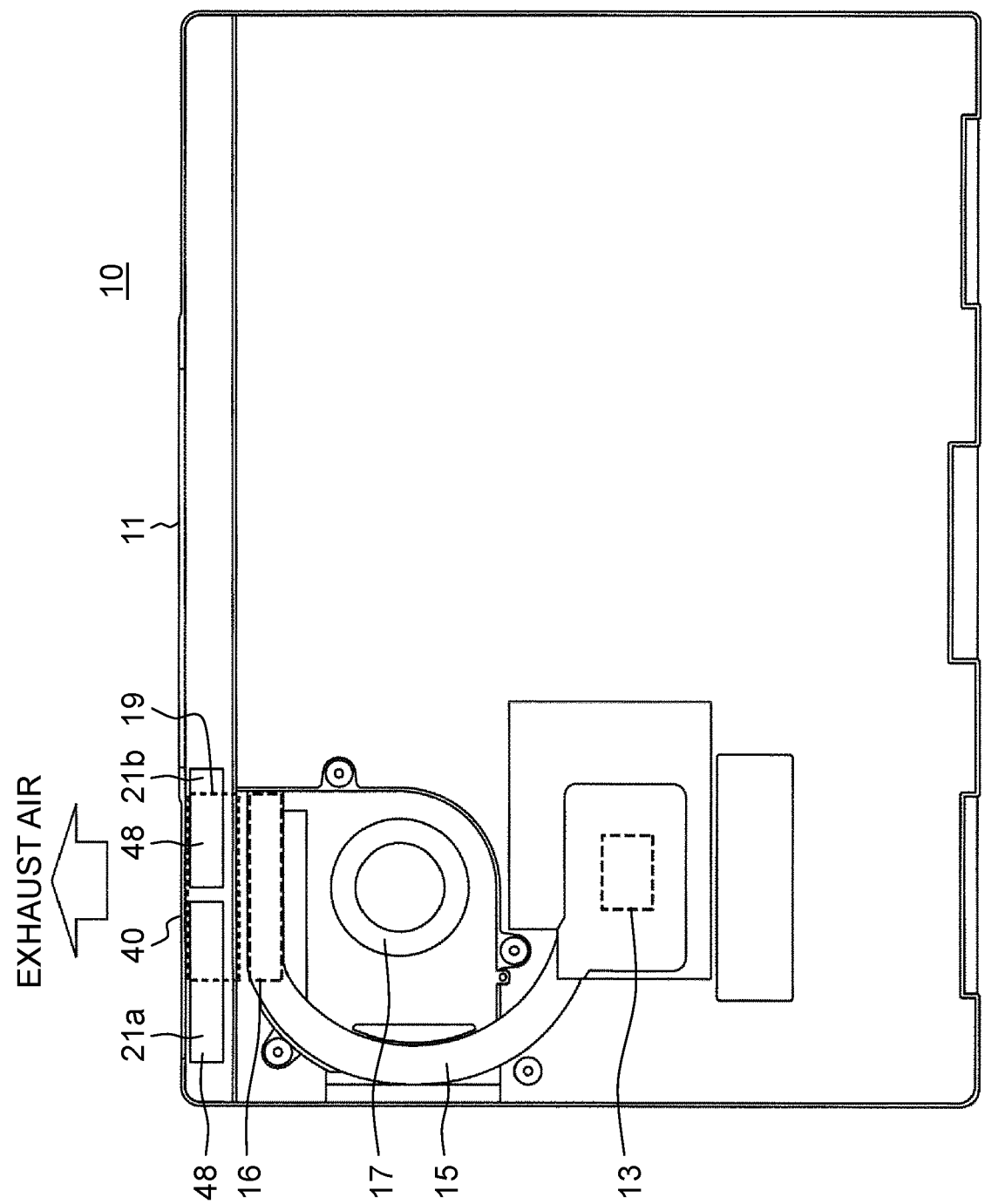
FIG. 3 is a diagram illustrating main parts of an antenna element and a cooling mechanism of the tablet terminal of the first exemplary embodiment.
Figure 4A:
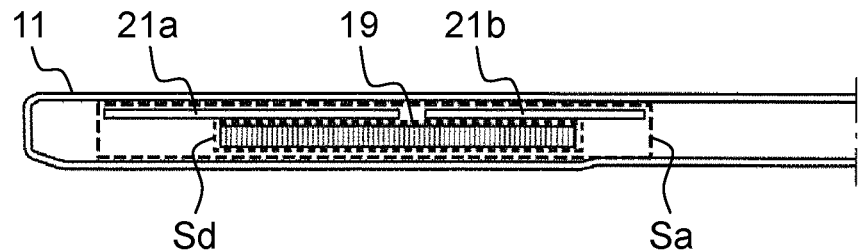
FIG. 4A is a diagram illustrating main parts of the antenna element and the cooling mechanism of the tablet terminal of the first exemplary embodiment.
Figure 4B:
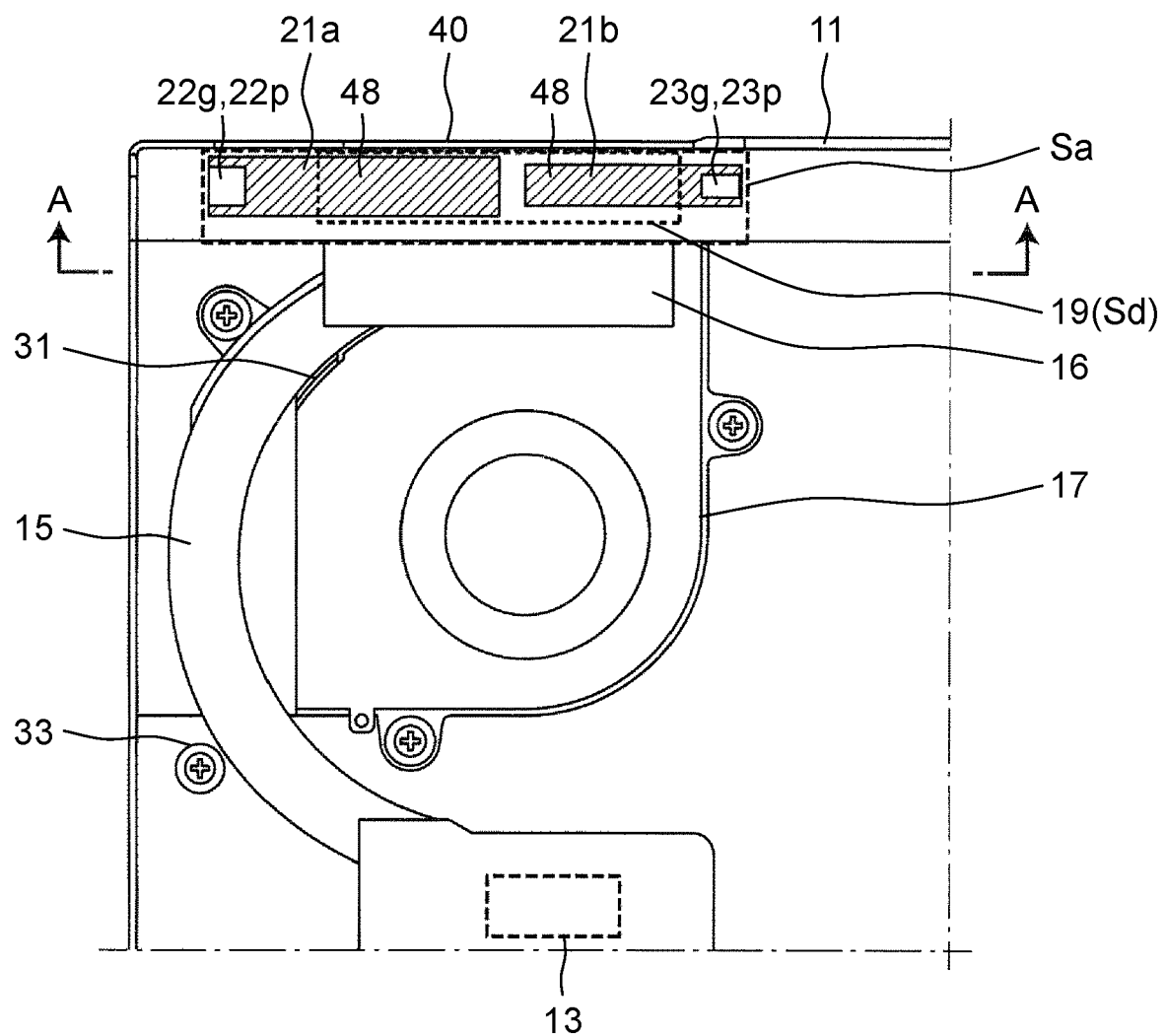
FIG. 4B is a diagram illustrating main parts of the antenna element and the cooling mechanism of the tablet terminal of the first exemplary embodiment.
Figure 5:
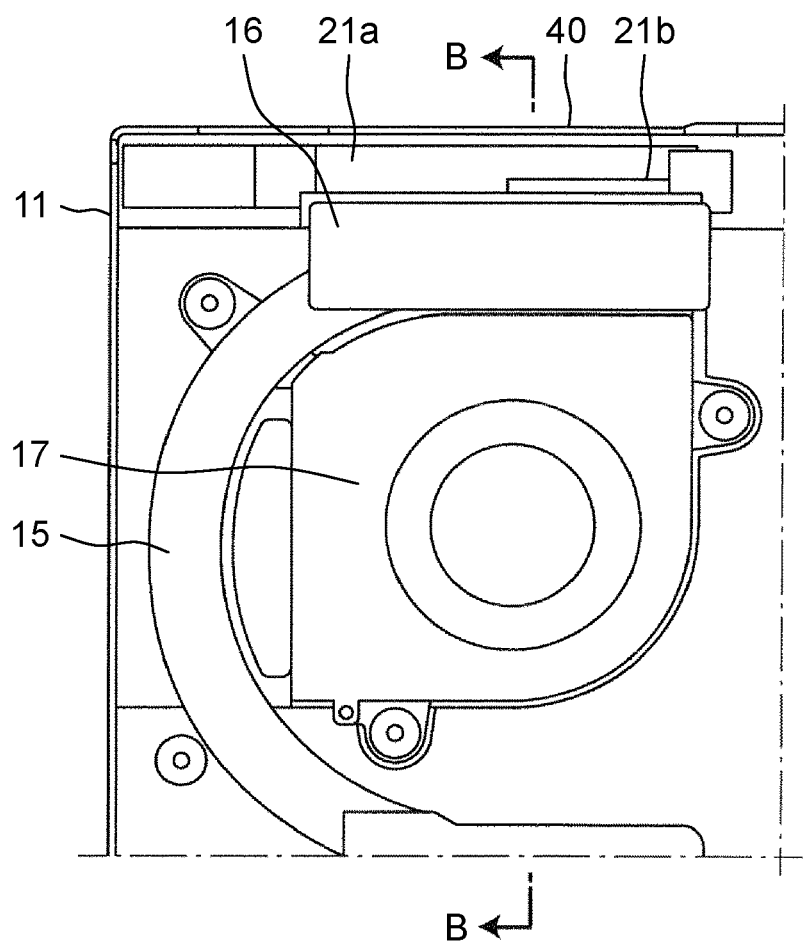
FIG. 5 is a diagram illustrating main parts of the antenna element and the cooling mechanism of the tablet terminal of the first exemplary embodiment.
Figure 6:
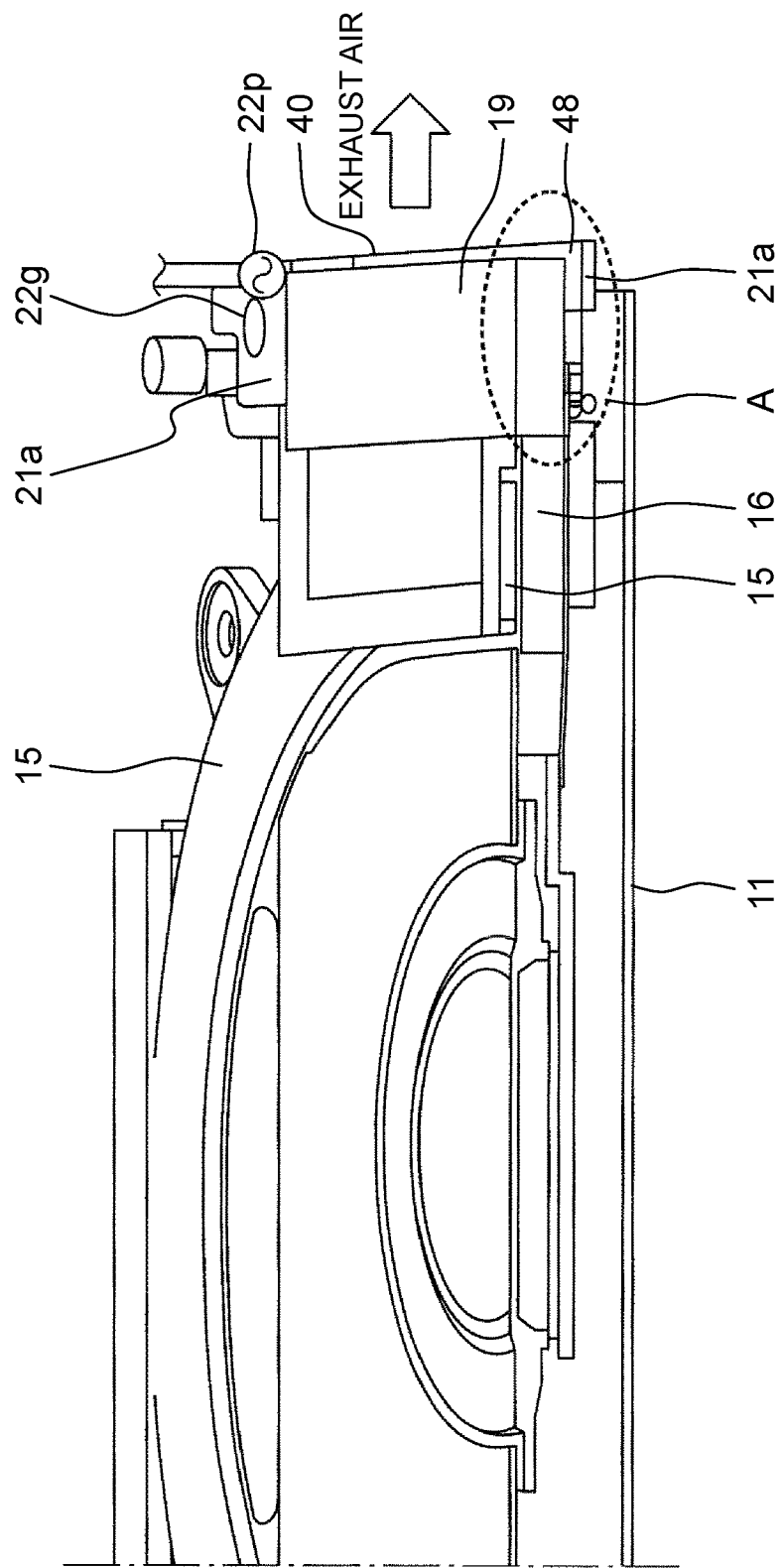
FIG. 6 is a cross-sectional view of the tablet terminal cut along line B-B in FIG. 5.

FIG. 3 to FIG. 6 are diagrams each illustrating a structure of the inside of tablet terminal 10. FIG. 3 to FIG. 5 are diagrams each illustrating main parts of an antenna element and a cooling mechanism of tablet terminal 10. FIG. 6 is a cross-sectional view of the structure in FIG. 5 cut along line B-B.

As shown in FIG. 3 to FIG. 6, tablet terminal 10 includes, inside case 11, CPU 13 as a heat source, heat pipe 15, heat dissipation fin 16, and cooling fan 17. Heat pipe 15 is thermally connected to CPU 13. Heat dissipation fin 16 is thermally connected to heat pipe 15. Cooling fan 17 generates an air flow for cooling heat dissipation fin 16 (hereinafter, the air flow is referred to as "cooling wind").

CPU 13 as a heat source generates heat whose temperature rises up to about 100° C., and the heat is efficiently conducted to heat dissipation fin 16 through heat pipe 15. Cooling fan 17 generates a cooling wind, and the cooling wind is blown to heat dissipation fin 16. Heat dissipation fin 16 is heated by the heat from CPU to a high temperature, the heat is exchanged between heat dissipation fin 16 and the cooling wind; thus, heat dissipation fin 16 is cooled, and the cooling wind is heated. This cools CPU 13 as a heat source.

The cooling wind subjected to heat exchange on heat dissipation fin 16 is discharged from exhaust port 40 to outside. For this purpose, tablet terminal 10 is provided with exhaust duct 19 that forms a passage for the cooling wind from heat dissipation fin 16 to exhaust port 40. Exhaust duct 19 has a hollow structure and is configured with a sheet-shaped resin member such as polycarbonate that does not impair an antenna performance. Exhaust duct 19 is a member for guiding the cooling wind generated by cooling fan 17 and having passed heat dissipation fin 16 to exhaust port 40, and exhaust duct 19 constitutes a passage from which air does not leak to the inside of the case through a gap between exhaust duct and heat dissipation fin 16 so that the cooling wind can be efficiently discharged without being disturbed. The cooling wind heated on heat dissipation fin 16 to a high temperature is cooled while passing through exhaust duct 19 of a length of 10 mm to 15 mm before reaching the case surface that is directly touched by a hand or body, and the cooling wind is discharged to outside from exhaust port 40 in a state where the temperature is lowered compared with just after heat dissipation fin 16.

FIG. 3 and FIG. 4B each do not directly show the exhaust duct so as to make clear positions of other components, and a position of the exhaust duct is shown by broken line 19 to make the position of the exhaust duct recognizable. These drawings show that exhaust duct 19 is disposed between heat dissipation fin 16 and exhaust port 40.

In addition, tablet terminal 10 includes antenna elements 21a, 21b for wireless communication adjacent to exhaust port 40 and exhaust duct 19. Antenna elements 21a, 21b each are a board antenna element of a housing embedded type that is a pattern (copper foil) of an antenna element such as a monopole antenna or an inverted-F antenna formed on a printed circuit board (PCB: Printed Circuit Board). Antenna elements 21a, 21b include therefore a base material (FR4 or other materials) of the printed circuit board for supporting the copper foil as antenna printed circuit board 48. Antenna element 21*a* is for wide-area communication radio such as 3G or LTE (Long-Term Evolution) and is a small-sized broad band multiband antenna compatible with multiband for wide-area wireless communication (700 MHz to 900 MHz band, 1400 MHz to 1500 MHz band, 1700 MHz to 2100 MHz band). Antenna element 21*b* is for short-distance communication and is a small-sized multiband antenna compatible with WiFi (IEEE802.11) and Bluetooth (registered trade mark) (2.4 GHz, 5 GHz to 6 GHz).

Antenna element 21*a* includes antenna feed point 22*p* that feeds power to antenna element 21*a*, and grounding point 22*g* at to which antenna element 21*a* is connected to ground (reference potential) by bolting. Antenna element 21*b* includes antenna feed point 23*p* that feeds power to antenna element 21*b*, and grounding point 23*g* at which antenna element 21*b* is connected to the ground. Antenna feed points 22*p*, 23*p* are connected via coaxial cables or microstrip lines to a communication module mounted on tablet terminal 10. Other than for the antenna elements for wide-area wireless communication and short-distance wireless communication disclosed here, the idea of the present disclosure can be practiced for antenna elements for other wireless communication such as UHF RFID.

Figure 12:
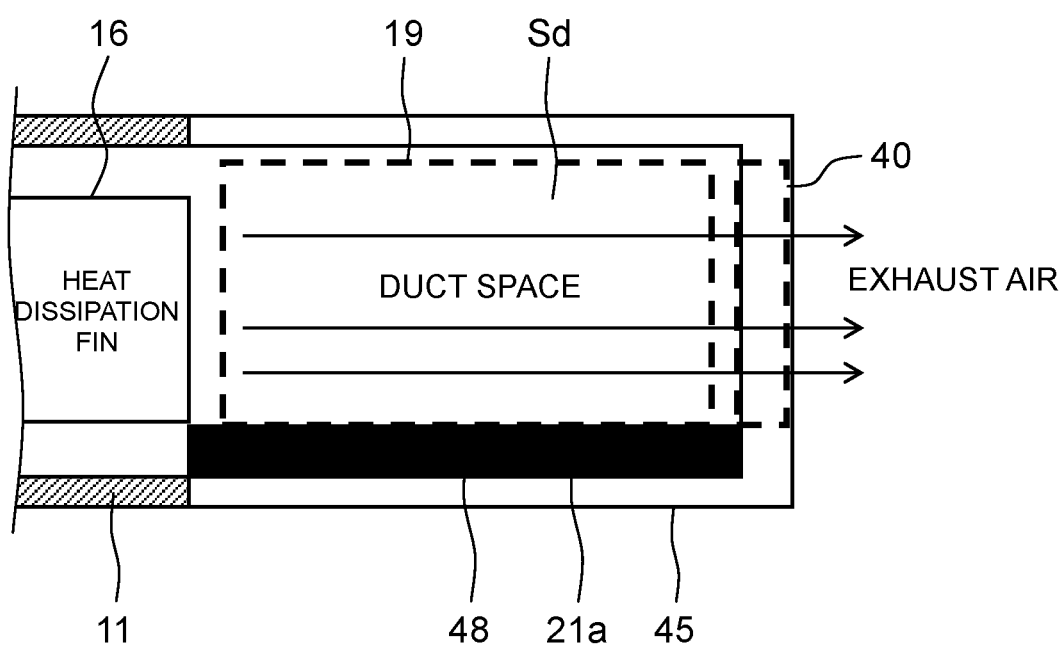
FIG. 12 is a diagram showing a configuration in which one side surface of a printed circuit board as a part of the exhaust duct.

FIG. 4A is a cross-sectional view of the configuration shown in FIG. 4B cut along line A-A. FIG. 4A shows that antenna elements 21*a*, 21*b* are disposed in an area other than an opening surface of exhaust duct 19 (broken line) so as not to overlap the opening. Antenna elements 21*a*, 21*b* can be configured with a printed circuit board (whose thickness is about 0.6 mm to 1.0 mm) and are accordingly thin, and parts of antenna elements 21*a*, 21*b* are disposed to overlap exhaust duct 19 in the thickness direction of tablet terminal 10. Further, antenna elements 21*a*, 21*b* can be configured on the same plane by sharing one printed circuit board. Further, since the printed circuit board is made of a sufficiently heat-resistant resin (FR4 or the like), one side surface of the printed circuit board can be configured to be shared with exhaust duct 19 (see FIG. 12).

In the periphery of antenna elements 21*a*, 21*b*, there needs to be antenna space Sa proportional to a frequency used so as to derive sufficient performances of the antennas. For example, in order to derive sufficient antenna performance for wide-area wireless communication with respect to tablet terminal 10 whose case thickness is about 5 mm to 10 mm, a free space of a range of 10 mm to 15 mm is saved, in which space there is no electric circuit or a structural object made of metal, carbon material, or the like. Antenna elements 21*a*, 21*b* are disposed outside of exhaust duct 19 (in other words, exhaust duct space Sd) so as not to disturb the flow of the cooling wind from cooling fan 17. Such an arrangement of antenna elements 21*a*, 21*b* and exhaust duct 19 enables antenna space Sa and duct space Sd to be used in common.

Figure 7:
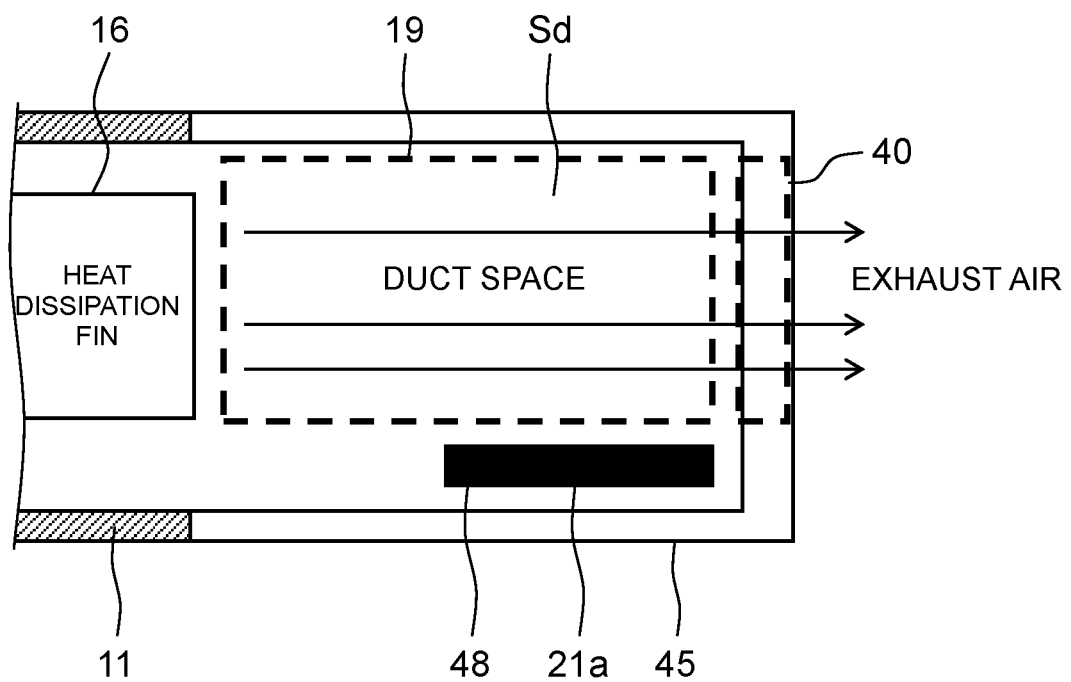
FIG. 7 is a diagram illustrating a positional relationship between an exhaust duct (duct space) and the antenna element of the tablet terminal of the first exemplary embodiment.

FIG. 7 is a diagram schematically illustrating a positional relationship among heat dissipation fin 16, antenna element 21*a*, and exhaust duct 19 in the area indicated by broken line A in FIG. 6. As shown in FIG. 7, exhaust port 40 is covered by outer shell cover 45. Outer shell cover 45 is a part of the tablet surface that is touched by a hand and have an air flow hole in a lattice shape through which the cooling wind from exhaust duct 19 flows through. Further, since the outer shell cover 45 is always exposed to a hot wind, the outer shell cover 45 is configured of a resin material that does not conduct heat well. Outer shell cover 45 is disposed to overlap exhaust duct 19, functions as an antenna cover for antenna elements 21*a*, 21*b*, and is adjacent to the antenna elements; therefore, outer shell cover 45 is configured of a resin material, which does not affect a radio performance.

On the surface of tablet terminal 10, a functionally necessary resin part is used in common. Outer shell cover 45 (resin) and case 11 (metal) can be configured as one member by two-color molding.

As shown in FIG. 7, exhaust duct 19 is disposed between heat dissipation fin 16 and exhaust port 40. Further, antenna element 21*a* is disposed on the lower side of exhaust duct 19. Specifically, antenna element 21*a* is disposed to overlap exhaust duct 19 in the thickness direction of tablet terminal 10. In other words, antenna element 21*a* is disposed adjacent to exhaust duct 19 in a direction perpendicular to a direction in which the cooling wind in exhaust duct flows.

Such an arrangement of the antenna element realizes space saving and downsizing on the side surface in the width direction or the longitudinal direction of tablet terminal 10, and increases a degree of freedom of the layout design of various terminals.

Since CPU 13 is a heat source and a noise source at the same time, a part of heat pipe 15 is connected to ground (reference potential). This arrangement provides a configuration that prevents an electric noise from CPU 13 from being received by antenna elements 21*a*, 21*b* via heat pipe 15 and heat dissipation fin 16 and prevents a wireless sensitivity from being degraded. Specifically, as shown in FIG. 4B, a part of heat pipe 15 is grounded by being electrically connected to case 11 through grounding structures 31, 33 (a metal bolt, a metal plate, a conductive sheet, or the like). Note that in addition to heat pipe 15, cooling fan 17 covering heat dissipation fin 16 may also be configured of metal and grounded. Further, heat dissipation fin 16 adjacent to antenna elements 21*a*, 21*b* influences a resonance frequency and a radio performance of the antenna in some cases, and the effect can be removed by appropriately setting a grounding point for heat pipe 15 and heat dissipation fin 16.

When tablet terminal 10 is used while being attached to base device 80, it is preferable in terms of an antenna element performance that the antenna element is at the highest possible position (on the zenith direction side). This arrangement can make the antenna element away from an obstacle such as a hand typing the keyboard or a desk that adversely affects the antenna performance. In addition, the antenna element and a communication device far away easily get a better view of each other. In view of these points, in the present exemplary embodiment, as shown in FIG. 1A, FIG. 1B, and FIG. 2, exhaust port 40 is disposed in a region R on the side surface on the opposite side, in the width direction, of the side surface on which connection parts 42*a*, 42*b* are provided. In addition, it is preferable that exhaust port 40 be provided at a position at which a user is not exposed to the discharged cooling wind and which a user's hand does not touch at the time of attachment and detachment of tablet terminal 10 to and from base device 80. For this reason, region R is set at a position that is on the upper-end side surface and is displaced from a center toward an end part in the longitudinal direction.

Due to the above-described disposition of exhaust port 40, it is possible to realize a higher antenna element performance and to improve user's convenience.

As described above, tablet terminal 10 (an example of an electronic device) of the present exemplary embodiment includes case 11, antenna elements 21*a*, 21*b*, CPU 13 (an example of a heat source), heat dissipation fin 16 (an example of a heat dissipation member), heat pipe 15 (an example of a heat conduction member), cooling fan 17, exhaust port 40, and exhaust duct 19. Case 11 has a pair of main surfaces facing each other in a thickness direction and side surfaces connecting between the pair of main surfaces. Antenna elements 21*a*, 21*b* are used to perform wireless communication. Heat dissipation fin 16 exchanges heat with a cooling wind. Heat pipe 15 conducts heat of CPU 13 to heat dissipation fin 16. Cooling fan 17 generates a cooling wind to be blown to heat dissipation fin 16. Exhaust port 40 is used to discharge to outside the cooling wind generated by cooling fan 17 and subjected to heat exchange on heat dissipation fin 16. Exhaust duct 19 guides the cooling wind having passed heat dissipation fin 16 to exhaust port 40. Exhaust port 40 is disposed on one of the side surfaces of case 11. Antenna elements 21*a*, 21*b* and exhaust duct 19 are disposed to overlap each other at least partially in the thickness direction of case 11. For example, antenna elements 21*a*, 21*b* is disposed to overlap exhaust duct 19 in a direction perpendicular to the direction in which the cooling wind in exhaust duct 19 flows.

As described above, on tablet terminal 10 having cooling fan 17, antenna elements 21*a*, 21*b* are disposed in the vicinity of exhaust duct 19. With the above arrangement, it is possible to realize space saving and downsizing on the side surface in the width direction or the longitudinal direction of tablet terminal 10, and it is possible to increase a degree of freedom of the layout design of various terminals.

In addition, heat pipe 15 is connected to ground (reference potential). This arrangement can prevent a noise from being conducted from CPU 13 to antenna elements 21*a*, 21*b*.

Tablet terminal 10 is detachable with respect to base device 80 having a keyboard and has, on one of the side surfaces, connection parts 42*a*, 42*b* to connect to base device 80. Antenna elements 21*a*, 21*b* are disposed on the side surface opposite to the side surface on which connection parts 42*a*, 42*b* of tablet terminal 10 are provided. Since antenna elements 21*a*, 21*b* are disposed as described above, when tablet terminal 10 is attached to base device 80, antenna elements 21*a*, 21*b* are located at a higher position (on the zenith direction side), and a better antenna element performance is thus obtained.

Further, antenna elements 21*a*, 21*b* are disposed to overlap exhaust port 40. It is considered that a user holds a part, of tablet terminal 10, different from exhaust port 40 from which a hot wind is discharged, and as a result, a user's hand does not get close to the vicinity of antenna elements 21*a*, 21*b*; thus, it is possible to prevent a communication performance from being lowered.

Second Exemplary Embodiment

Another exemplary embodiment of the present disclosure will be described with reference to FIG. 8 to FIG. 11. In the present exemplary embodiment, configurations of antenna element and a tablet terminal are different from the first exemplary embodiment.

Tablet terminal 10 of the present exemplary embodiment also includes a display and a touch panel function similarly to the first exemplary embodiment Further, tablet terminal 10 is a terminal detachable with respect to base device 80 (see FIG. 1A and FIG. 1B).

Figure 8:
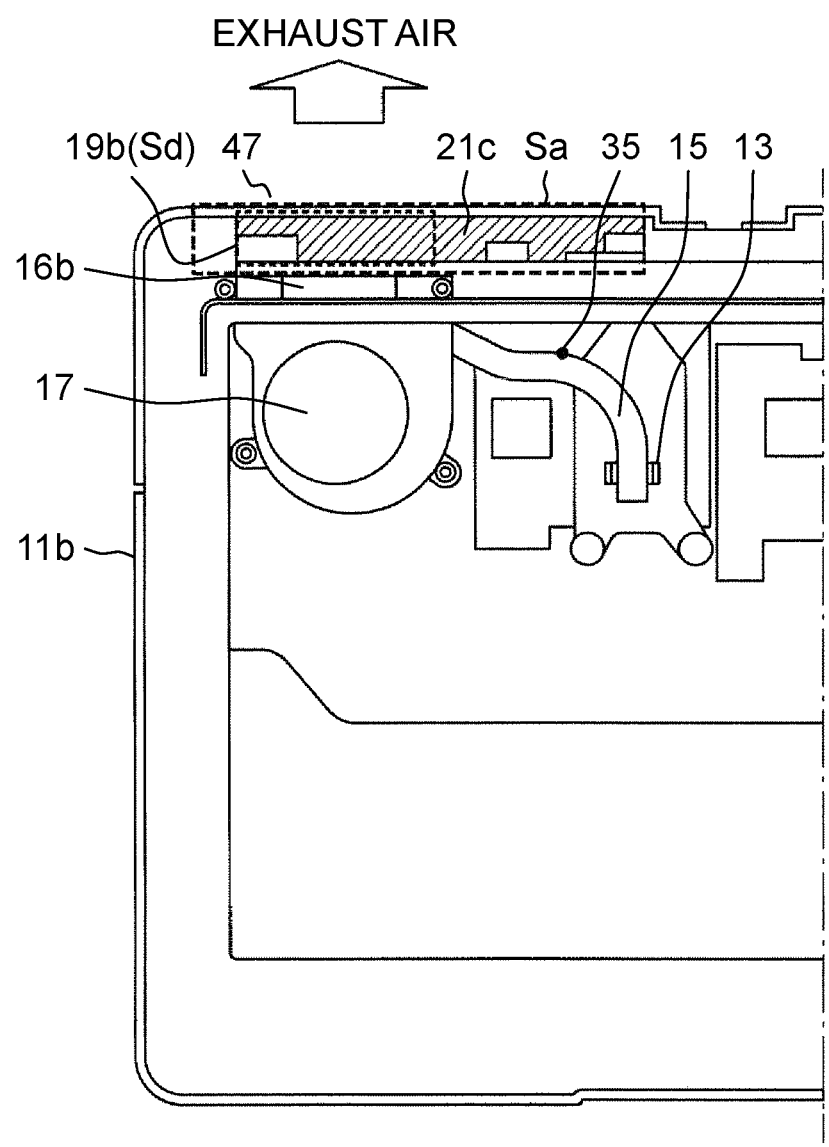
FIG. 8 is a diagram illustrating main parts of an antenna element and a cooling mechanism of a tablet terminal of a second exemplary embodiment.

FIG. 8 is a diagram illustrating main parts of the antenna element and a cooling mechanism of tablet terminal 10 of the present exemplary embodiment. As shown in FIG. 8, tablet terminal 10 of the present exemplary embodiment also includes a similar cooling mechanism to the first exemplary embodiment. Specifically, tablet terminal 10 includes, in case 11*b*, CPU 13 as a heat source, heat pipe 15, heat dissipation fin 16*b*, and cooling fan 17. Heat pipe 15 is thermally connected to CPU 13. Heat dissipation fin 16*b* is thermally connected to heat pipe 15. Cooling fan 17 generates a cooling wind to cool heat dissipation fin 16*b*. Heat pipe 15 is grounded to case 11*b* with grounding structure 35 (conductor).

Antenna element 21*c* is disposed in the vicinity of exhaust port 47 of tablet terminal 10. Similarly to the first exemplary embodiment, antenna element 21*c* is an antenna element to be used for a relatively long-distance communication such as communication to a communication network provided by a communication carrier (for example, 3G and LTE). Antenna element 21*c* is a board antenna element of a housing embedded type that is a pattern (copper foil) of an antenna element, such as a monopole antenna or an inverted-F antenna, formed on a flexible printed circuit board (FPC: Flexible Printed Circuit). Since FPC has a flexible sheet shape, antenna element 21*c* is fixed with antenna support member 46 configured of resin such as acrylonitrile butadiene styrene (ABS) resin that does not lower an antenna performance (see FIG. 11). Note that antenna element 21*c* may be formed integrally on outer shell cover 45 side FIG. 8 does not directly show the exhaust duct so as to make clear a position of antenna element 21*c*, and a position of exhaust duct 19*b* is indicated by a broken line. As shown by the broken line, exhaust duct 19*b* (broken line) is disposed between heat dissipation fin 16*b* and exhaust port 47. Similarly to the first exemplary embodiment, exhaust duct 19*b* is disposed to overlap antenna element 21*c* in a thickness direction of tablet terminal 10 (see FIG. 11). In the present exemplary embodiment, since exhaust duct 19*b* can be resin-molded in a complex solid shape having a curved plane and a hole, antenna support member 46 is used in common as exhaust duct 19*b*. By this configuration, a passage is configured in such a manner that air does not leak inside the case through a space such as a space between the passage and heat dissipation fin 16. Exhaust duct 19*b* is formed with a predetermined member surrounding a space (duct space Sd) communicating from heat dissipation fin 16*b* to exhaust port 47. Due to the above layout of antenna element 21*c* and exhaust duct 19*b*, antenna space Sa and duct space Sd are used in common.

Figure 9A:
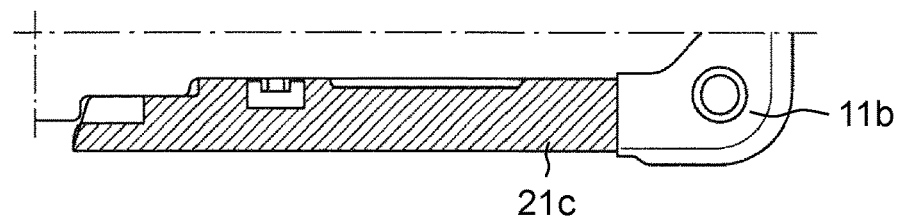
FIG. 9A is a diagram showing how the antenna element is disposed in the tablet terminal of the second exemplary embodiment.
Figure 9B:
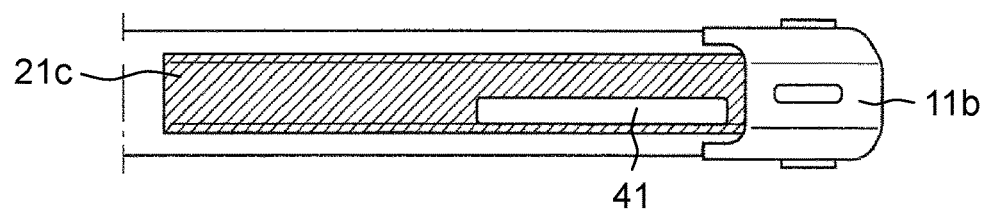
FIG. 9B is a diagram showing how the antenna element is disposed in the tablet terminal of the second exemplary embodiment.
Figure 9C:
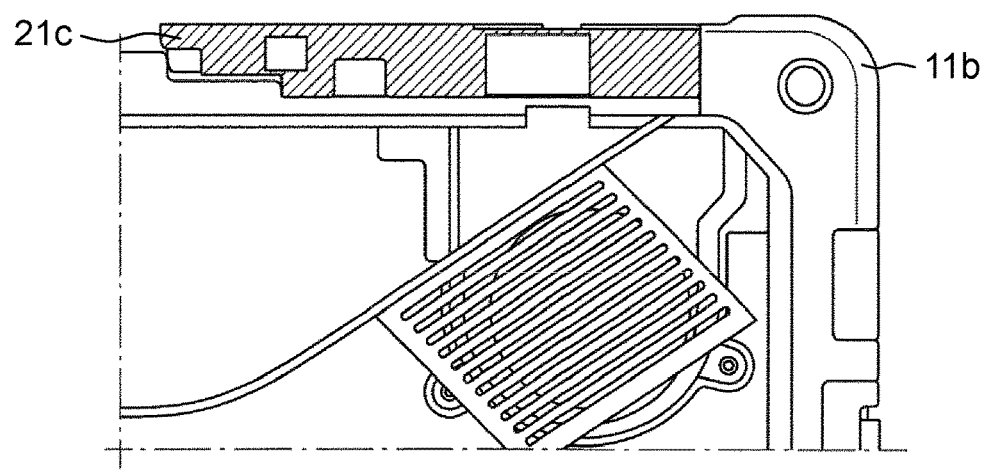
FIG. 9C is a diagram showing how the antenna element is disposed in the tablet terminal of the second exemplary embodiment.
Figure 9D:
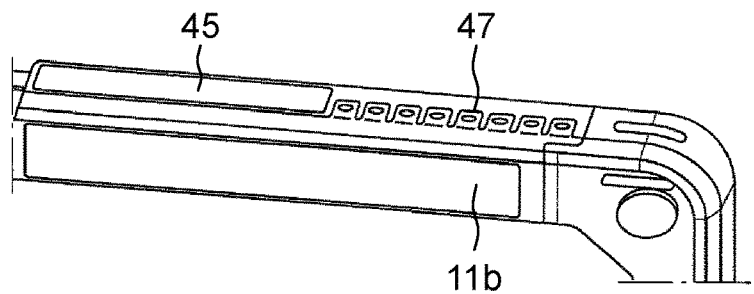
FIG. 9D is a diagram showing an exhaust port of the tablet terminal.

FIG. 9D is a diagram showing an outer appearance in the vicinity of the exhaust port of tablet terminal 10. Tablet terminal 10 includes exhaust port 47 for discharging a cooling wind having been heated to outside. Exhaust port 47 is provided on outer shell cover 45 formed of resin. Inside of this outer shell cover 45, there is disposed antenna element 21*c*.

FIG. 9A to FIG. 9C are diagrams each showing a state where outer shell cover 45 is removed and antenna element 21*c* is thus exposed. FIG. 9A is a view of tablet terminal 10 when viewed from a front surface side (a main surface side on which a display is provided). Antenna element 21*c* includes: antenna feed point 28*p* to feed power to antenna element 21*c*; and grounding point 28*g* at which antenna element 21*c* is connected to ground. FIG. 9B is a view of tablet terminal 10 when viewed from a side surface side. FIG. 9C is a view of tablet terminal 10 when viewed from a rear surface side.

In first exemplary embodiment, antenna elements 21*a*, 21*b* have a flat panel shape, but antenna element 21*c* of the present exemplary embodiment has a cross-section in an approximate square-cornered U-shape (or U-shape) and is fixed with antenna support member 46 inside the approximate square-cornered U-shape. Specifically, as shown in FIG. 9A to FIG. 9C, antenna element 21*c* is configured with one parallel part and the other two parts. The one parallel part is parallel to the side surface of tablet terminal 10, and the other two parts each extend, on each of both sides of the parallel part, perpendicularly to the parallel part.

As shown in FIG. 9B, antenna element 21*c* has exhaust opening 41 for discharging the cooling wind to outside, in the part parallel to the side surface of tablet terminal 10. Exhaust opening 41 is formed at a position corresponding to a position of exhaust port 47. Thorough this exhaust opening 41 and exhaust port 47, the cooling wind generated by cooling fan 17 is discharged outside of tablet terminal 10.

Figure 10:
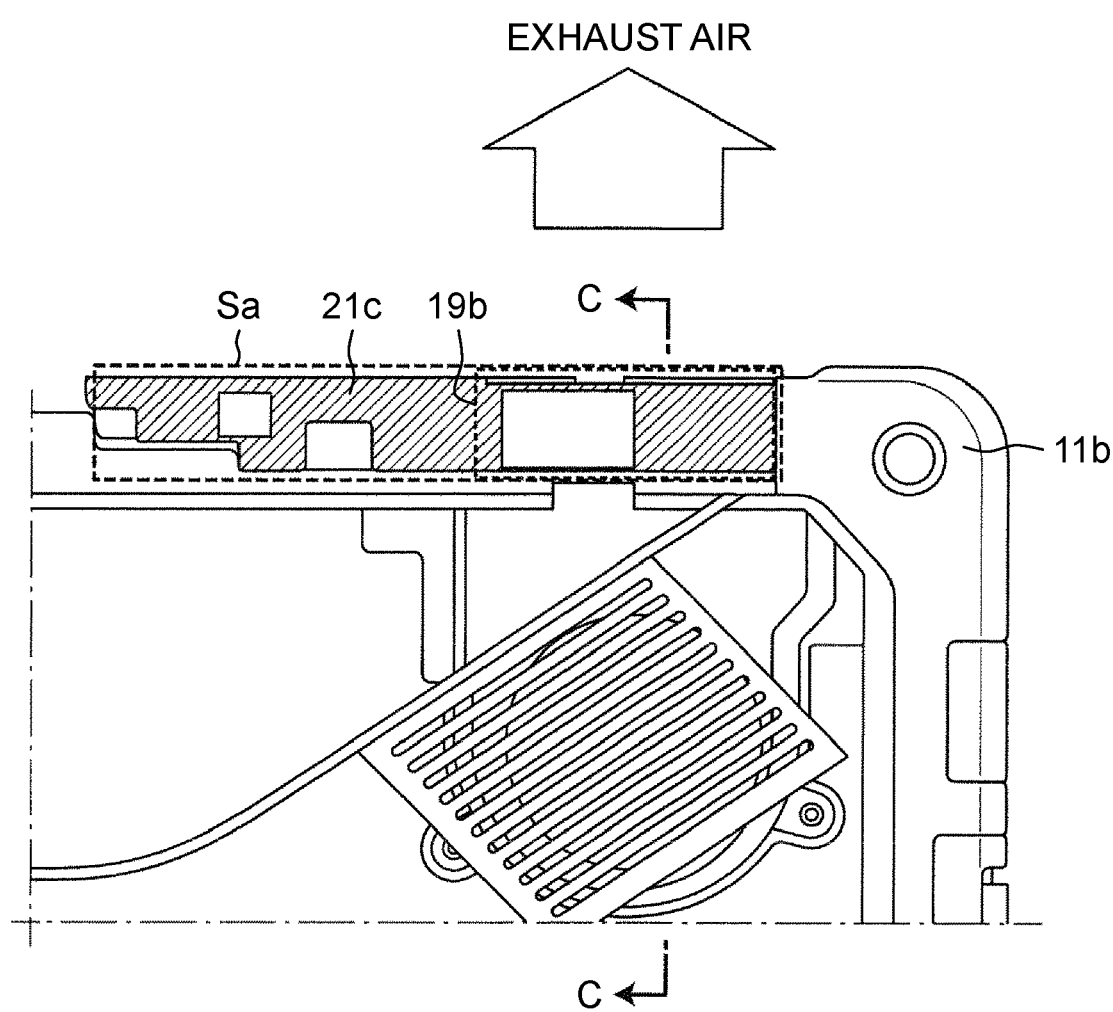
FIG. 10 is a diagram illustrating main parts of the antenna element and the cooling mechanism of the tablet terminal of the second exemplary embodiment.
Figure 11:
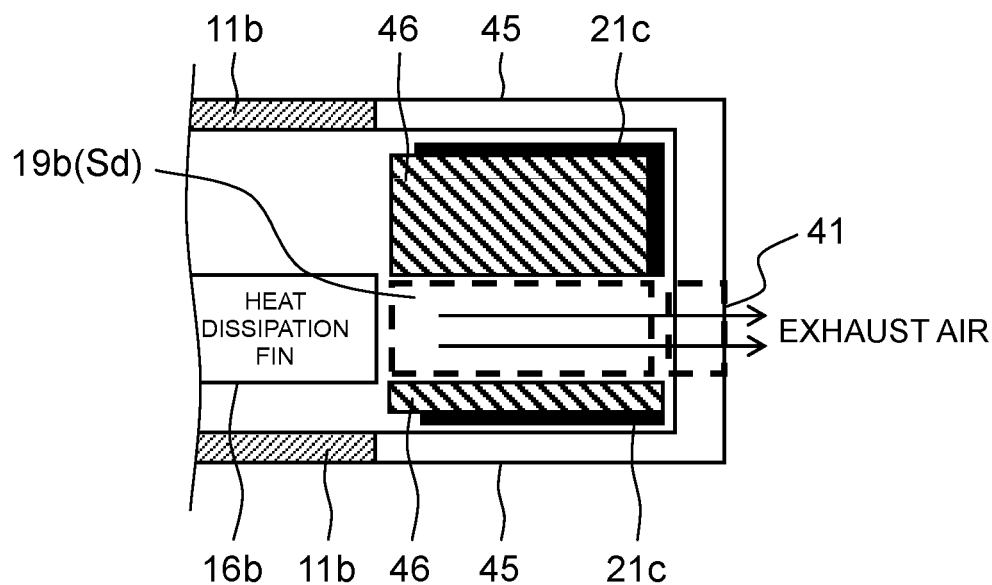
FIG. 11 is a diagram illustrating a positional relationship between the exhaust duct (duct space) and the antenna element of the tablet terminal of the second exemplary embodiment.

FIG. 10 is a view of tablet terminal 10 when viewed from the rear surface side. FIG. 11 is a cross-sectional view of the configuration of FIG. 10 cut along line C-C, and schematically illustrates a positional relationship of heat dissipation fin 16*b*, antenna element 21*c*, exhaust duct 19*b*, and exhaust opening 41. As shown in FIG. 11, exhaust duct 19*b* is disposed between heat dissipation fin 16*b* and exhaust opening 41. Antenna element 21*c* is disposed to overlap exhaust duct 19*b* on the upper side and the lower sided of exhaust duct 19*b* (that is, in the thickness direction of tablet terminal 10). In other words, antenna element 21*c* is disposed adjacent to exhaust duct 19*b* in a direction perpendicular to the direction in which the cooling wind flows in the exhaust duct.

Due to the disposition of antenna element 21*c* as described above, similarly to the case of the first exemplary embodiment, it is possible to realize space saving and downsizing on the side surface in the width direction or the longitudinal direction of tablet terminal 10, and it is possible to increase a degree of freedom of the layout design of various terminals. In addition, by disposing antenna element 21*c* in the vicinity of exhaust port 47, it is possible to prevent a user from holding a part close to the antenna element, and quality of communication can be prevented from being lowered.

Other Exemplary Embodiments

The first and second exemplary embodiments have been described above as examples of the techniques disclosed in the present disclosure. However, the techniques of the present disclosure can be applied not only to the above exemplary embodiments but also to exemplary embodiments in which modification, replacement, addition, or removal is appropriately made. Further, it is possible to form a new exemplary embodiment by combining the components described in the first and second exemplary embodiments. Thus, other exemplary embodiments will be described below as examples.

In the above exemplary embodiments, antenna elements 21*a* to 21*c* are each an antenna element to be used for relatively long-distance communication such as communication to a communication network provided by a communication carrier (for example, 3G and LTE); however, antenna elements to be used are not limited to the above types, and other types of antenna elements may be used.

The above exemplary embodiments have been described by taking tablet PC as an example of electronic devices; however, the ideas of the present disclosure can be applied to other electronic devices. Specifically, if an electronic device includes an internal antenna element and an air-cooled type cooling mechanism, the ideas of the present disclosure about the disposition of an antenna element can be applied to the electronic device.

In the above exemplary embodiments, the exhaust duct may be configured with a hollow member. Alternatively, it is possible to realize the function of the exhaust duct by forming a duct space by surrounding a predetermined space with members such as a wall, a rib, a substrate, and a seal.

In the above exemplary embodiments, a CPU has been described as an example of a heat source; however, if an element generates heat, the heat source is not limited to a CPU.

As described above, the exemplary embodiments have been described as examples of the techniques in the present disclosure. For that purpose, the accompanying drawings and the detailed description have been provided.

Therefore, in order to illustrate the above techniques, the components described in the accompanying drawings and the detailed description can include not only components necessary to solve the problem but also components unnecessary to solve the problem. For this reason, it should not be immediately recognized that those unnecessary components are necessary just because those unnecessary components are described in the accompanying drawings and the detailed description.

In addition, because the above exemplary embodiments are for illustrating the techniques in the present disclosure, various modifications, replacements, additions, removals, or the like can be made without departing from the scope of the accompanying claims or the equivalent thereof.

INDUSTRIAL APPLICABILITY

The present disclosure can be applied to an electronic device (for example, a tablet terminal) including an internal antenna element and an air-cooled type cooling mechanism.

REFERENCE MARKS IN THE DRAWINGS

10: tablet terminal
11, 11*b*: case
13: heat source (CPU)
15: heat pipe (heat conduction member)
16, 16*b*: heat dissipation fin (heat dissipation member)
17: cooling fan
19, 19*b*: exhaust duct
21*a*, 21*b*, 21*c*: antenna element
31, 33, 35: grounding structure
40, 47: exhaust port
41: exhaust opening
42*a*, 42*b*: connection part
45: outer shell cover
46: antenna support member
48: antenna printed circuit board
50: display
80: base device
82: keyboard
84: touch pad
86*a*, 86*b*: hinge part
87: connector
100: information processing device
R: region where antenna elements are disposed
Sa: antenna space
Sd: duct space

The invention claimed is:
1. An electronic device comprising:
a case, the case including:
a pair of main surfaces facing each other in a thickness direction; and
side surfaces connecting between the pair of main surfaces;

an antenna element used to perform wireless communication;

a heat source;

a heat dissipation member that exchange heat with a cooling wind;

a heat conduction member that conducts heat of the heat source to the heat dissipation member;

a cooling fan that generates the cooling wind to be blown to the heat dissipation member;

an exhaust port from which the cooling wind generated by the cooling fan and subjected to heat exchange on the heat dissipation member is discharged to the outside of the electronic device; and an exhaust duct that guides the cooling wind subjected to heat exchange on the heat dissipation member to the exhaust port, wherein the exhaust port is disposed on one of the side surfaces, and the antenna element and the exhaust duct are disposed to overlap each other at least partially in the thickness direction.

2. The electronic device according to claim 1, wherein the heat conduction member is grounded to a reference potential.

3. The electronic device according to claim 1, wherein at least a part of the exhaust duct is configured with the antenna element.

4. The electronic device according to claim 1, further comprising an antenna support member that supports the antenna element, wherein at least a part of the exhaust duct is configured with the antenna support member.

5. The electronic device according to claim 1, wherein the electronic device is a tablet terminal.

6. The electronic device according to claim 5, further comprising, on one of the side surfaces, a connection part for connection to a base device having a keyboard, wherein the electronic device is detachable with respect to the base device, and the antenna element is disposed on another one of the side surfaces that faces the one of the side surfaces of the electronic device.

* * * * *